United States Patent [19]

Witte

[11] Patent Number: 4,744,010

[45] Date of Patent: May 10, 1988

[54] ELECTRICAL COMPONENT MOUNTING APPARATUS WITH ISOLATED CONDUCTORS

[76] Inventor: Donald H. Witte, 7331 Oakbluff, Dallas, Tex. 75240

[21] Appl. No.: 894,666

[22] Filed: Aug. 8, 1986

[51] Int. Cl.⁴ .............................................. H05K 7/02

[52] U.S. Cl. ...................................... 367/417; 174/97; 174/101; 361/419; 439/207; 439/391

[58] Field of Search .................... 174/101, 97; 339/20, 339/21 R, 22 R, 23, 97 R, 97 P, 98, 99 R, 147 R, 147 P, 148; 361/331, 332, 428, 417–420

[56] References Cited

U.S. PATENT DOCUMENTS

| | | | |
|---|---|---|---|
| 1,620,814 | 3/1927 | Getchell | 361/360 |
| 2,988,617 | 6/1961 | Graziosi | 339/147 R |
| 3,029,303 | 4/1962 | Severino | 174/97 |
| 3,821,688 | 6/1974 | Larsile | 174/97 |
| 3,909,502 | 9/1975 | Lacan | 174/97 |

FOREIGN PATENT DOCUMENTS

| | | | |
|---|---|---|---|
| 2260371 | 6/1974 | Fed. Rep. of Germany | 339/97 R |
| 2458553 | 6/1975 | Fed. Rep. of Germany | 339/147 P |
| 2097279 | 3/1972 | France | 339/21 R |
| 2052890 | 1/1981 | United Kingdom | 339/20 |

*Primary Examiner*—Philip H. Leung
*Assistant Examiner*—Gregory D. Thompson
*Attorney, Agent, or Firm*—Kanz, Scherback & Timmons

[57] ABSTRACT

Apparatus for the removable mounting of electrical components such that the connecting and/or disconnecting of the electrical component to or from electrical conductors does not expose an individual to contact with the electrical conductors is disclosed. The apparatus comprises a strip member having a plurality of grooves therein to accept an electrically conductive member therein, a face cover member to cover the plurality of grooves and a module structure to be removably mounted to the strip member. The face cover member has a plurality of apertures therein such that an aperture is positioned over each of the grooves. The module structure includes structure for removably mounting the electrical component therein and structure for removably connecting the electrical component across a plurality of the electrical conductors by physically penetrating the electrical conductors after passing through predetermined apertures in the face cover member.

20 Claims, 3 Drawing Sheets

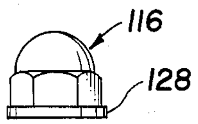
Fig. 8
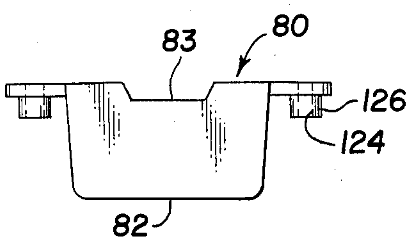
Fig. 7
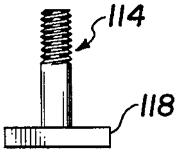
Fig. 9
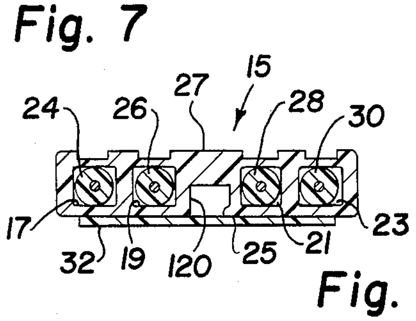
Fig. 11
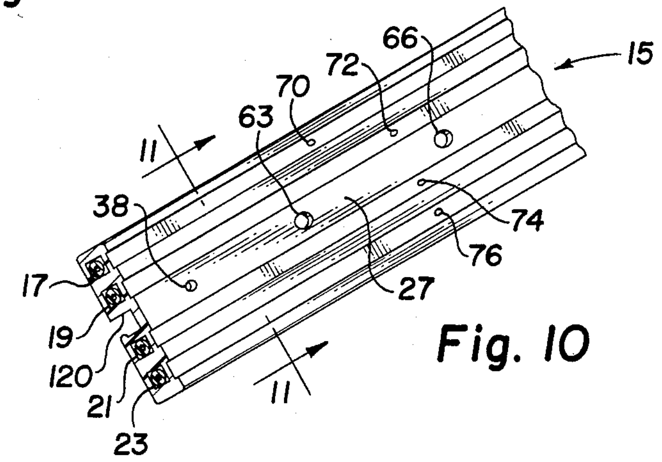
Fig. 10
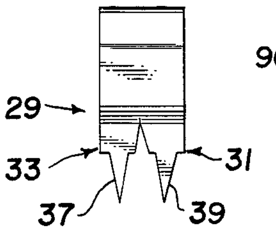
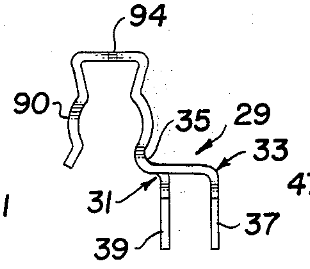
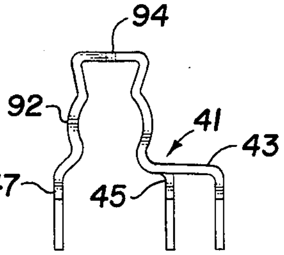
Fig. 12a Fig. 12b Fig. 13

ELECTRICAL COMPONENT MOUNTING APPARATUS WITH ISOLATED CONDUCTORS

BACKGROUND OF THE INVENTION

1. Field of the Invention

This invention relates in general to new and improved apparatus for the mounting and energizing of electrical components. More particularly, the present invention relates to new and improved apparatus for the removable mounting of electrical components such that the connecting and/or disconnecting of the electrical component from electrical conductors does not expose an individual to contact with the electrical conductors since the electrical conductors are isolated from contact by an individual thereby providing greater safety to the individual.

Although the present invention is applicable for numerous electrical components such as relays, resistors, integrated circuits, transformers, etc., it has been found to be particularly useful in the mounting and energizing of lights and lighting. Therefore, without limiting the applicability of the invention to lights and lighting, the invention will be described in that environment.

2. Description of the Prior Art

For the use of protected electrical circuit wiring, wiring has previously been carried out by employing metal and/or plastic conduit, armored or sheathed cable, or by enclosing wire conductors in metal and/or plastic molding which may be fastened to various surfaces with staples, clamps, etc. Electrical components which are to be energized by the wiring are connected to the wiring in closed electrical boxes for safety purposes. Much of the difficulty in using wiring of this type is that the individual wires must be cut to length, bared or stripped of its insulation and then individually connected, all of which is quite time consuming and thus expensive. If the components are to be removed, then the reverse process is also time consuming and thus expensive.

Attempts have been made to provide apparatus which will alleviate some of the problems. For example, U.S. Pat. No. 3,214,579 discloses a Christmas tree lighting system comprising a plurality of contiguously arranged sections each of which includes an elongated insulating member formed with a pair of spaced slots which extend the length of said sections. One of the side walls in each of the slots is formed with a generally dove-tail configuration throughout its length. An elongated conductor is positioned in each slot and includes a mounting portion to retain the conductor in place.

U.S. Pat. No. 3,500,036 discloses a decorative strip lighting system constructed of a flexible dielectric material. The system consists of an elongated body with a plurality of slits arranged longitudinally of the strip such that electrical conducting wires may be inserted therein. Also arranged along the length of the strip are a series of blind bores open on one face to admit light bulbs.

U.S. Pat. No. 3,659,247 discloses a modular conductor system for electrical circuit wiring utilizing assemblies each constituted by a composite insulated conductor. Such an insulated conductor assembly comprises a first elongate member of substantially homogeneous electrically nonconductive material having substantially uniform transverse dimensions and substantially planar ends. A plurality of spaced-apart channels each extending lengthwise of the member are provided in a surface thereof. A plurality of electrically conductive members, each having a relatively thin, substantially uniform cross section, fit snugly lengthwise into corresponding ones of the channels.

U.S. Pat. No. 4,181,388 discloses a tap member with axially adjustable contact for use with a multi-conductor electrical track, e.g., a track having four conductors, namely, three live conduits and neutral conduit. The tap member is adjustable to enable the same to be connected selectively to any one of the three circuits defined between the live conduits and the neutral conduit.

The present invention as claimed is intended to provide electrical component mounting apparatus which eliminates many of the prior art deficiencies which include the degree of difficulty and expense in the installation and connection of electrical components. In the prior art lighting systems, the electrical conductors and mounting therefor tended to detract from the overall pleasing appearance of the lighting system. Many of the prior art systems require regularly spaced supports along the length thereof which detracted from the appearance of the system. Some prior art systems are heavy and cumbersome. In some multi-circuit power distribution systems it has been necessary to stock a plurality of different tapping mechanisms.

SUMMARY OF THE INVENTION

The present invention provides apparatus for removably mounting electrical components and connecting same across a predetermined number of a predetermined quantity of electrical conductors such that the connecting and/or removal of the electrical component from the electrical conductors does not expose an individual to contact with the electrical conductors thereby providing greater safety to the individual. The electrical conductors are carried in grooves formed in a strip or track member which has a plurality of spaced-apart grooves. A face cover member is positioned against a first face of the strip member to cover the plurality of grooves. The face cover member includes a number of apertures formed therein and positioned such that a different one of said number of apertures is positioned over a predetermined different one of the plurality of spaced-apart grooves in said strip or track member. A module structure is configured to be removably mounted to the strip or track member. The module structure includes means for mounting an electrical component thereon and further includes means for removably connecting said electrical component between a predetermined number of the electrical conductive members. The means for removably connecting extend through predetermined apertures formed in said face cover member.

Among the advantages of the present invention are the ability to easily and removably mount electrical components in a module structure. The module structure may be easily connected and/or disconnected across electrical conductors. The present invention is light in weight and pleasing in appearance. The present invention results in the electrical conductors being insulated from the individual connecting and/or disconnecting the module structure from the electrical conductors thereby providing greater safety to the individual. The present invention may be quickly and easily mounted to appropriate surfaces.

Examples of the more important features and advantages of this invention have thus been summarized rather broadly in order that the detailed description thereof that follows may be better understood and in order that the contribution to the art may be better appreciated. There are, of course, additional features of the invention that will be described hereinafter and which will also form the subject of the claims appended hereto. Other features of the present invention will become apparent with reference to the following detailed description of a presently preferred embodiment thereof in connection with the accompanying drawing, wherein like reference numerals have been applied to like elements in which:

BRIEF DESCRIPTION OF THE DRAWING

FIG. 7 is a simplified side elevational view of the module structure of the present invention;

FIG. 8 is a simplified side elevational view of a portion of the mounting means for the module structure of the present invention;

FIG. 9 is a simplified side elevation view of a portion of the mounting means for the module structure of the presention invention;

FIG. 10 is a simplified perspective view of an additional embodiment of the strip member of the present invention;

FIG. 11 is a simplified sectional view of the present invention as taken along lines 11—11 of FIG. 10;

FIG. 12*a* is a simplified front elevational view of a further embodiment of the electrical component mounting means and connecting means of the present invention;

FIG. 12*b* is a simplified side elevational view of the electrical component mounting means and connecting means of FIG. 12*a;* and FIG. 13 is a simplified side elevational view of an additional embodiment of the electrical component mounting means and connecting means of the present invention.

DESCRIPTION OF THE PREFERRED EMBODIMENT

Figure 3:
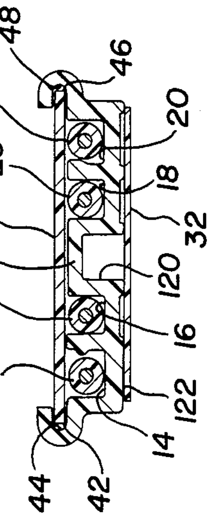
FIG. 3 is a simplified sectional view of the present invention as taken along lines 3—3 in FIG. 1.
Figure 2:
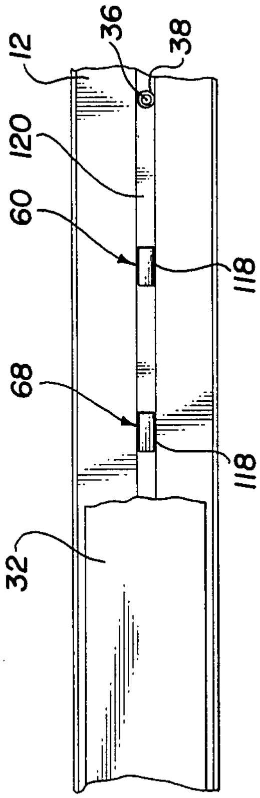
FIG. 2 is a simplified rear elevational view of the strip member of the present invention.

Referring now to the drawing and in particular to FIGS. 1-4, an electrical component mounting apparatus according to the present invention is generally referred to by reference numeral 10. The electrical component mounting apparatus 10 comprises a strip or track member 12. In the preferred embodiment, strip or track member 12 is formed of an electrically nonconductive material such as a nonrigid synthetic resin material which allows the strip or track member 12 to be curved in the longitudinal dimension. It will be appreciated that strip or track member 12 could be formed of an electrically conductive material and could be used as a ground or as the return conduit or conductor. A multiple number of grooves 14, 16, 18 and 20 are formed in the face or front 22 of strip or track member 12 with the grooves being spaced apart from each other a predetermined distance. It will be appreciated that any reasonable number of grooves could be formed in strip member 12 and is not limited to four grooves. In the preferred embodiment, groove 14 is dimensioned to accept a number twelve insulated electrical conductor 24 while grooves 16-20 are each dimensioned to accept a number fourteen insulated electrical conductor 26-30, respectively. As previously stated, strip or track member 12 could be formed of an electrically conductive material if the electrical conductors 24-30 are insulated as they are shown in the disclosed embodiment. It will be appreciated that the grooves could be dimensioned to accept other sizes of insulated electrical conductors.

First fastening means 32 is used to attach strip member 12 to the desired surface 34 which could be a wall or any reasonably flat surface. In the preferred embodiment, fastening means 32 comprises an adhesive double-faced tape, glue, epoxy, etc. positioned on the back of strip member 12 or screw means 36 in conjunction with first aperture 38 which is formed in strip member 12.

A face cover member 40 is installed to cover grooves 14-20 and the electrical conductors 24-30 positioned therein by positioning a first edge 42 of face cover member 40 in first groove 44 of strip or track member 12 and second edge 46 in second groove 48. Face cover member 40 is slidably inserted into the covering position with respect to strip member 12. In the preferred embodiment, strip or track member 12 is approximately five sixteenths of an inch in thickness, approximately thirty inches in length but could be any reasonable length depending upon the installation. Face cover member 40 is formed of an electrically nonconductive nonrigid material which may also be curved in the longitudinal direction.

Figure 4:
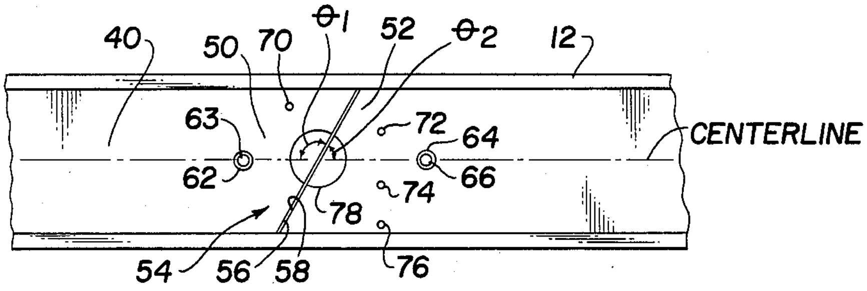
FIG. 4 is a simplified front elevational view of the strip member and face cover member of the present invention.

Adjacent face cover members lie substantially in the same plane in strip member 12 and has a first end portion 50 and a second end portion 52. With reference to FIG. 4, a first end portion 50 of a face cover member 40 is shown in end-abutting relationship with a second end portion 52 of an adjacent face cover member 40. Positioning means 54 assures that adjacent face cover members 40 are properly oriented and positioned with respect to each other. In the preferred embodiment, positioning means 54 comprises a first edge 56 of first end portion 50 with said first edge 56 being cut at a first predetermined angle $\theta_1$ with respect to the longitudinal centerline of face cover member 40 and a second edge 58 of second end portion 52 of the face cover member 40 and the adjacent face cover member 40 with said second edge 58 being cut at a second predetermined angle $\theta_2$ with respect to the longitudinal centerline of the face cover member 40 and the adjacent face cover member 40. It will be appreciated that each face cover member 40 has the first end portion 50 cut at the first predetermined angle and the second end portion 52 cut at the second predetermined angle. First predetermined angle $\theta_1$ and second predetermined angle $\theta_2$ are supplementary angles. In the preferred embodiment, first predetermined angle $\theta_1$ is one hundred twenty degrees and second predetermined angle $\theta_2$ is sixty degrees but it will be appreciated that these angles are not limited to the preferred values. It will be appreciated that positioning means 54 could take other forms which would assure that adjacent face cover members 40 are properly oriented and positioned with respect to each other, such as a tongue and groove assembly which is offset from the longitudinal centerline of the face cover members 40, etc.

In the preferred embodiment, second aperture 62 is formed at a predetermined position in first end portion 50 which aligns with third aperture 63 formed in strip or track member 12. Second fastening means 60 extends through second aperture 62 and third aperture 63. Second end portion 52 includes fourth aperture 64 which aligns with fifth aperture 66 formed in strip or track member 12. Third fastening means 68 extends through fourth aperture 64 and fifth aperture 66. Second fastening means 60 and third fastening means 68 removably mount module structure 80 to strip or track member 12 and face cover member 40. Other apertures are also formed in first end portion 50 and second end portion 52. Sixth aperture 70 is formed in first end portion 50 to align generally with the centerline of groove 14. Seventh aperture 72 is formed in second end portion 52 to align generally with the centerline of groove 16. Eighth aperture 74 is formed to align generally with the centerline of groove 18. Ninth aperture 76 is formed to align generally with the centerline of groove 20.

Positioning means 54 assures that second aperture 62 will align with third aperture 63, that fourth aperture 64 will align with fifth aperture 66 and that sixth through ninth apertures 70, 72, 74 and 76 will align with the centerline of grooves 14, 16, 18 and 20, respectively. Reflective means 78 is positioned generally midway between second aperture 62 and fourth aperture 64 on the centerline of face cover member 40 and across first and second edges 56 and 58. Reflective means 78 may be a predetermined amount of reflective paint or a reflective surface on a stick-on member or the reflectivity of the face cover member 40 itself.

It will be appreciated that the positioning of the previously discussed apertures, the second aperture 62 through the ninth aperture 76, is not limited to being placed or positioned at the first end portion 50 and the second end portion 52 as previously discussed. The second aperture 62 through the ninth aperture 76 may be positioned at any location along the strip or track member 12 and face cover member 40 as long as the positioning of the apertures with respect to each other and the strip or track member 12 and face cover member 40 remains as disclosed in FIG. 4.

When insulated electrical conductors 24, 26, 28 and 30 are operatively positioned in grooves 14, 16, 18 and 20, respectively, insulated electrical conductor 24 is common with respect to insulated electrical conductors 26, 28 and 30. Therefore, when electrical components or lamps 86 are connected across insulated electrical conductors 24 and 26, insulated electrical conductors 24 and 28 and insulated electrical conductors 24 and 30, the electrical components or lamps 86 will be activated only when the particular circuit, to which they are connected, is energized.

Figure 1:
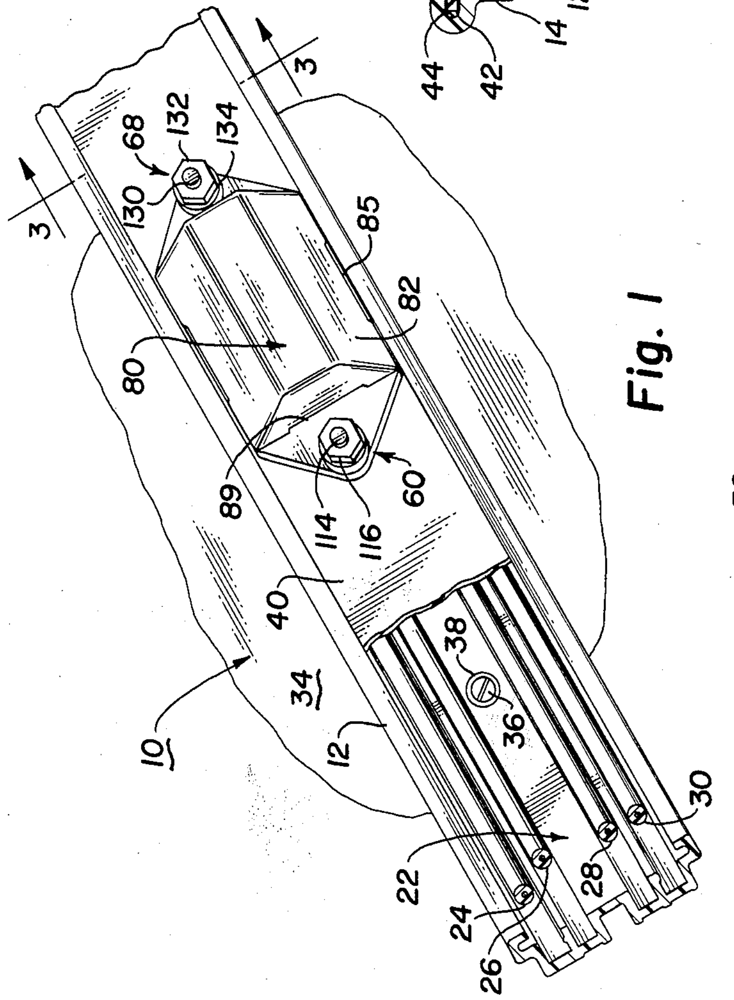
FIG. 1 is a simplified perspective view of a component mounting apparatus with isolated conductors constructed according to the present invention.

With reference to FIGS. 1 and *5a, 5b, 6a–6c* and 7 module structure 80 is shown removably mounted to strip or track member 12 and face cover member 40 by second fastening means 60 and third fastening means 68. Module structure 80 comprises lens or housing 82, mounting means 84 for physically mounting an electrical component or lamp 86 to the module structure 80 and for providing electrical contact to the electrical component or lamp 86 and connecting means 88 for electrically connecting mounting means 84 and an electrical component or lamp 86 across predetermined insulated conductors positioned in strip or track member 12.

In the disclosed embodiment, lens or housing 82 is formed of a clear synthetic resin material which is electrically nonconductive. It will be appreciated that the lens or housing 82 which is clear will allow more light to pass therethrough but the lens or housing 82 could be colored. Reflective means 78 (FIG. 4) will reflect heat generated by the electrical component or lamp 86 away from face cover member 40 and thereby assist in the dissipation of the generated heat and will also assist in causing more light to be emitted through lens or housing 82. First cutout 83 and second cutout 85 are formed in opposite sides of lens or housing 82. Third cutout 87 and fourth cutout 89 are formed in the remaining opposite sides of lens or housing 82. Cutouts 83, 85, 87 and 89 allow air to flow through the volume of air surrounded by lens or housing 82 and thereby help to cool the electrical component or lamp 86 mounted within the lens or housing 82. Cutouts 83–89 also allow any moisture or liquid, which might be introduced into the volume surrounded by lens or housing 82, to drain out and/or evaporate regardless of the particular orientation of the strip or track member 12 and the module structure 80.

In the disclosed embodiment, mounting means 84 comprises a first spring-type electrically conductive holder 90, similar to a fuse holder, for releasably gripping a first end of the electrical component or lamp 86 and a second spring-type electrically conductive holder 92 for releasably gripping a second end of the electrical component or lamp 86. It will be appreciated that if the electrical component 86 was, for example, a small printed circuit board then mounting means 84 might comprise a terminal strip or a socket. Mounting means 84 includes a tenth aperture 94 in the first and second spring-type electrically conductive holders 90 and 92. Tenth aperture 94 is positioned over post 96, which is formed as part of the lens or housing 82 in each end thereof, and secured thereto by heat staking or ultrasonic staking.

In the disclosed embodiment, connecting means 88 comprises a first blade-like electrically conductive member 98 of predetermined length and curvature with a first end 100 and a second end 102 and a second blade-like electrically conductive member 104 of predetermined length and curvature with a first end 106 and a second end 108. It will be appreciated that connecting means 88 is mechanically formed as a continuation of mounting means 84 and is connected thereto as a one-piece structure but that connecting means 88 could be formed as a separate structure and then be electrically connected to mounting means 84 by a coupling or link means. Second end 102 and second end 108 are formed to include a pointed portion 110 and 112, respectively, which are capable of physically penetrating the insulation of the insulated electrical conductors 24, 26, 28 and 30 and making electrical contact with the conductors therein. When pointed portions 110 and 112 make electrical contact with a predetermined two of the insulated electrical conductors 24, 26, 28 and 30, then the electrical component or lamp 86 will be capable of being activted when an activating voltage is applied across those two insulated electrical conductors.

Figure 5A:
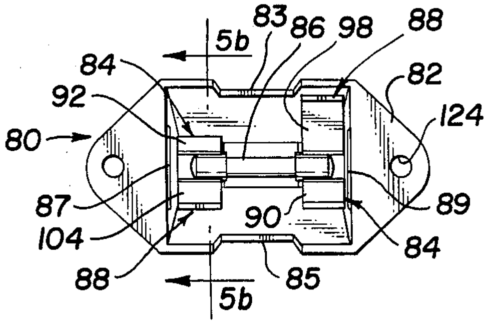
FIG. 5*a* is a simplified rear elevational view of the module structure of the present invention.
Figure 5B:
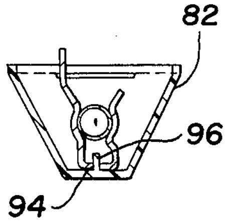
FIG. 5*b* is a simplified sectional view of the present invention as taken along lines 5—5 in FIG. 5*a;*

In the disclosed embodiment, an electrical component or lamp 86 may be connected across insulated electrical conductor 24 and a particular one of the three remaining insulated electrical conductors 26, 28 and 30. This determination is made when choosing the particular configuration of connecting means 88 and the particular orientation of the connecting means 88 when mounting same in module structure 80. With reference to FIGS. 5*a* and 6*a*–6*c*, the location and orientation of electrically conductive holder 90 and first blade-like member 98 is the same for each module structure 80 as shown on the right side as seen in FIG. 5*a*. The particular electrically conductive holder and the particular blade-like member which is mounted on the left side, as shown in FIG. 5*a*, determines which of the remaining three insulated electrical conductors the other terminal of the electrical component or lamp 86 is to be connected.

Figure 6A:
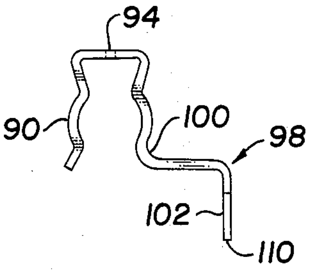
FIG. 6*a* is a simplified side elevational view of one of the electrical component mounting means and connecting means of the present invention.
Figure 6B:
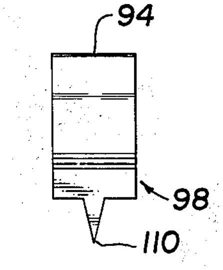
FIG. 6*b* is a simplified front elevational view of the electrical component mounting means and connecting means of FIG. 6*a;*
Figure 6C:
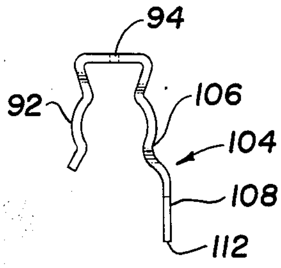
FIG. 6*c* is a simplified side elevational view of another embodiment of the electrical component mounting means and connecting means of the present invention.

If electrically conductive holder 92 and second blade-like member 104, as shown in FIG. 6*c*, are mounted in module structure 80, as shown in FIG. 5*a*, with the second blade-like member 104 below electrically conductive holder 92, then electrical component or lamp 86 will be connected across insulated electrical conductors 24 and 28 when module structure 80 is removably mounted to strip or track member 12. Second end 102 of first blade-like member 98 will protrude through fifth aperture 70 and into insulated electrical conductor 24. Second end 108 of second blade-like member 104 will protrude through seventh aperture 74 and into insulated electrical conductor 28.

If electrically conductive holder 92 and second blade-like member 104 are mounted in module structure 80 with an orientation of one hundred and eighty degrees from that shown in FIG. 5*a*, with the second blade-like member 104 above electrically conductive holder 92, then electrical component or lamp 86 will be connected across insulated electrical conductors 24 and 26 when module structure 80 is removably mounted to strip or track member 12. Second end 108 of second blade-like member 104 will protrude through sixth aperture 72 and into insulated electrical conductor 26.

If an electrically conductive holder 90 and first blade-like member 98 were mounted in module structure 80 on tne left side thereof, as seen in FIG. 5*a*, and oriented such that the first blade-like member 98 were below the electrically conductive holder 90, then electrical component or lamp 86 will be connected across insulated electrical conductors 24 and 30 when module structure 80 is removably mounted to strip or track member 12. Second end 102 of first blade-like member 98 will protrude through eighth aperture 76 and into insulated electrical conductor 30.

By choosing a particular one of the above three described configurations of module structures 80, an electrical component or lamp 86 may be connected across any of the possible combinations of insulated electrical conductors along the multiple number of sections of strip or track members 12.

It will be appreciated that when preparing various face cover members 40 for the mounting of a module structure 80, it would not be necessary to form seventh aperture 72, eighth aperture 74 and ninth aperture 76 in each face cover member 40. It would only be necessary to form either seventh aperture 72, eighth aperture 74 or ninth aperture 76 or a predetermined combination thereof depending upon which insulated electrical conductor or conductors (conductor 26, 28 or 30) were going to be used in conjunction with insulated electrical conductor 24 to energize the electrical component or lamp 86.

With reference to FIGS. 1–5*a*, 7, 8 and 9, various elements of second fastening means 60 and third fastening means 68 are disclosed. Second fastening means 60 comprises T-stud 114 and nut 116, both of which are formed from an electrically nonconductive material. The head 118 of T-stud 114 is rectangular in shape and is dimensioned to fit into groove 120 formed in the back surface 122 of strip or track member 12. T-stud 114 extends through third aperture 62 (formed in first end portion 50) and eleventh aperture 124 (in lens or housing 82). Nut 116 is attached to T-stud 114 and tightened down against projection 126, formed on lens or housing 82, to complete the mounting of one side of module structure 80 to strip or track member 12 and face cover member 40. Lip 128 on nut 116 extends past the peripheral surface of projection 126.

Third fastening means 68 comprises T-stud 130 and nut 132, both of which are formed from an electrically nonconductive material. T-stud 130 and nut 132 are shaped and sized like T-stud 114 and nut 116 and are employed on the side of module structure 80 opposite T-stud 114 and nut 116 to complete the mounting of module structure 80 to strip or track member 12 and face cover member 40. Lip 134 is formed on nut 132. It will be appreciated that T-studs 114 and 130 act as pilots for aligning and placing module structure 80 on strip or track member 12 and face cover member 40. In addition, as nuts 116 and 132 are drawn down on T-studs 114 and 130, the inclined plane of the threads thereon provide a leverage advantage and thereby provide the force required for pointed portions 110 and 112 to pierce the insulation of the insulated conductors and make electrical contact with the conductors themselves.

With reference to FIGS. 10 and 11, an additional embodiment of strip or track member 12 together with the face cover member 40 is disclosed and referred to as a one-piece strip member 15. In the preferred embodiment, one-piece strip member 15 is extruded of an electrically nonconductive material such as a nonrigid synthetic resin material which allows one-piece strip member 15 to be curved in the longitudinal dimension. One-piece strip member 15 includes a predetermined number of tunnel-like passages 17, 19, 21 and 23 which will allow electrical conductors 24, 26, 28 and 30 to be inserted therein. A separate face cover member 40 is not necessary. It will be appreciated that the number of tunnel-like passages are not limited to the disclosed four. Groove 120 formed in the back surface 25 of one-piece strip member 15 is configured to accommodate second fastening means 60 and third fastening means 68.

Prior to the insertion of electrical conductors 24, 26, 28 and 30 into tunnel-like passages 17, 19, 21 and 23, first aperture 38, third aperture 63, fifth aperture 66, sixth aperture 70, seventh aperture 72, eighth aperture 74 and ninth aperture 76 (or any selected ones thereof) may be formed in one-piece strip member 15 through the face or front portion 27, although it is possible to form the apertures in one-piece strip member 15 with the electrical conductors 24, 26, 28 and 30 in place in the tunnel-like passages 17, 19, 21 and 23. In one embodiment of the one-piece strip member 15, the face or front portion 27 is formed with a reduced thickness over the tunnel-like passages 17, 19, 21 and 23 that allows pointed portions 110 and 112 of connecting means 88 (FIG. *6a–6c*) to more easily penetrate and extend through the face or front portion 27 and make electrical contact with the electrical conductors in a particular tunnel-like passage when second and third fastening means 60 and 68 operatively attach the module structure 80 to the one-piece strip member 15.

With reference to FIGS. 12*a*, 12*b* and 13, additional embodiments of connecting means are disclosed. Connecting means 29 comprises two blade-like electrically conductive members 31 and 33 of predetermined length and curvature with a common first end 35 and second ends 37 and 39. Second ends 37 and 39 are configured and spaced such as to contact two different electrical conductors when module structure 80 is operatively mounted to strip or track member 12 or the one-piece strip member 15. It will be appreciated that an additional connecting means is also included in the module structure 80, as previously shown in FIG. 5*a*.

FIG. 13 discloses an additional embodiment of the connecting means and is disclosed as connecting means 41 which comprises three blade-like electrically conductive member 43, 45 and 47. Blade-like electrically conductive members 43 and 45 are similar to blade-like electrically conductive members 31 and 33. Blade-like electrically conductive member 47 is connected to the opposite end of spring-type electrically conductive holder 92 and will contact a different electrical conductor than member 43 and 45 when module structure 80 is operatively mounted to strip or track member 12 or the one-piece strip member 15. By using connecting means 29 and 41 (and variations thereof) the electrical component or lamp 86 may be activated by energizing different electrical conductors and thereby not be limited to being activated by just two of the conductors.

It will be appreciated that module structure 80 provides means for removably mounting electrical components across electrical conductors whereby the electrical components may be energized by the voltage across the electrical conductors. When the module structure 80 is removed from the strip or track member 12, the electrical components are removed with the module structure 80 and also the elements which connect the electrical components to the electrical conductors are removed and the individual removing or changing module structures 80 is not exposed to contact with the energizing voltage across the electrical conductors.

Thus it is apparent that there has been provided in accordance with this invention, electrical component mounting apparatus with electrically isolated conductors that substantially incorporates the advantages set forth above. The present invention provides protected electrical circuit wiring with means to removably mount electrical components across electrical conductors which does not expose an individual to contact with the electrical conductors.

Although the present invention has been described in conjunction with specific forms thereof, it is evident that many alternatives, modifications and variations will be apparent to those skilled in the art in light of the foregoing disclosure. Accordingly, this description is to be construed as illustrative only and is for the purpose of teaching those skilled in the art the manner of carrying out the invention. It is understood that the forms of the invention herewith shown and described are to be taken as the presently preferred embodiment. Various changes may be made in the shape, size and arrangement of parts. For example, equivalent elements may be substituted for those illustrated and described herein, parts may be reversed, and certain features of the invention may be utilized independently of other features of the invention. It will be appreciated that various modifications, alternatives, variations, etc., may be made without departing from the spirit and scope of the invention as defined in the appended claims.

What is claimed is:

1. Electrical component mounting apparatus for enabling the energization of electrical components when said apparatus is operatively connected to an energy source, said electrical component mounting apparatus comprising:

a strip member having a plurality of spaced-apart grooves running longitudinally of the strip member and opening at a first face thereof, each spaced-apart groove structured to accept an electrically conductive member positioned in each spaced apart groove;

a face cover member of electrically nonconductive material, said face cover member structured to be positionable to cover said opening of said plurality of spaced-apart grooves, said face cover member including a predetermined plurality of apertures formed therein and located therein such that each predetermined one of said predetermined plurality of apertures is positioned over a predetermined different one of said plurality of spaced-apart grooves when said face cover member is positioned to cover said opening of said plurality of spaced-apart grooves, said face cover member including positioning means to assure that adjacent face cover members are properly oriented and positioned with respect to each other;

a module structure removably mounted to said strip member, said module structure including means removably mounting an electrical lamp thereon, said module structure further including means removably connecting said electrical lamp between a predetermined plurality of the electrical conductive members when said electrical conductive members are operatively positioned in said spaced-apart groove, said means removably connecting extends through respective said predetermined plurality of apertures formed in said face cover member; and means removably mounting said module structure to said strip member.

2. The apparatus of claim 1 wherein said strip member is formed of an electrically nonconductive material.

3. The apparatus of claim 1 wherein said strip member is formed of an electrically conductive material.

4. The apparatus of claim 1 wherein said module structure includes a housing means covering said means removably mounting said electrical lamp and said means removably connecting said electrical lamp, whereby said means removably mounting said electrical lamp and said means removably connecting said electrical lamp are not accessible to contact by an individual when said module structure is removably mounted to said strip member.

5. The apparatus of claim 4 wherein said housing means is formed of an electrically nonconductive material.

6. The apparatus of claim 5 wherein said electrically nonconductive mateiral is clear to allow any light energy from said electrical lamp to pass therethrough.

7. The apparatus of claim 5 wherein said electrically nonconductive material is colored.

8. The apparatus of claim 1 wherein said face cover member includes a first end portion and a second end portion, said positioning means includes a first edge of said first end portion and a second edge of said second end portion, said first edge being cut at a first predetermined angle with respect to the longitudinal centerline of said face cover member and said second edge being cut at a second predetermined angle with respect to the longitudinal centerline of said face cover member, said first predetermined angle and said second predetermined angle being supplementary angles.

9. The apparatus of claim 1 wherein said means removably mounting said electrical lamp includes a first spring-type electrically conductive holder for releasably gripping a first end of said electrical lamp.

10. The apparatus of claim 9 wherein said means removably mounting said electrical lamp includes a second spring-type electrically conductive holder for releasably gripping a second end of said electrical lamp.

11. The apparatus of claim 1 wherein said means removably connecting includes a first blade-like electrical conductive member, said first blade-like electrically conductive member being formed to be capable of extending through at least one of said predetermined plurality of aperture formed in said face cover member when said module structure is mounted to said strip member and to be capable of physically penetrating and making electrical contact with at least one of electrical conductive members when electrical conductive members are positioned in predetermined ones of said plurality of spaced-apart grooves of said strip member.

12. The apparatus of claim 1 wherein said means removably connecting includes a second blade-like electrically conductive member, said second blade-like electrically conductive member being formed to be capable of extending through at least a second one of said predetermined plurality of apertures formed in said face cover member when said module structure is mounted to said strip member and to be capable of physically penetrating and making electrical contact with at least a different one of electrical conductive members when electrical conductive members are positioned in predetermined ones of said plurality of spaced-apart grooves of said strip member.

13. The apparatus of claim 1 further including means on said strip member to hold said face cover member in operative position to cover said opening of said plurality of spaced-apart grooves.

14. The apparatus of claim 13 wherein said means on said strip member to hold said face cover member comprises grooves into which predetermined portions of said face cover member are positioned.

15. Electrical component mounting apparatus for enabling the energization of electrical components when said apparatus is operatively connected to an energy source, said electrical component mounting apparatus comprising:

a strip member having a plurality of spaced-apart grooves running longitudinally of the strip member and opening at a first face thereof, each spaced-apart groove structure to accept an electrically conductive member positioned in each spaced-apart groove;

a plurality of electrically conductive members with a predetermined different one of said plurality of electrically conductive members positioned in each spaced-apart groove;

a face cover member of electrically nonconductive material, said face cover member structure to be positionable to cover said opening of said plurality of spaced-apart grooves, said face cover member including a predetermined plurality of apertures formed therein and located therein such that each predetermined one of aid predetermined plurality of apertures is positioned over a predetermined different one of said plurality of spaced-apart grooves when said face cover member is positioned to cover said opening of said plurality of spaced-apart grooves, said face cover member including positioning means to assure that adjacent face cover members are properly oriented and positioned with respect to each other;

a module structure removably mounted to said strip member, said module structure including means removably mounting an electrical lamp thereon, said module structure further including means removably connecting said electrical lamp between a predetermined plurality of the electrical conductive members positioned in said spaced-apart grooves, said means removably connecting extends through respective said predetermined plurality of apertures formed in said face cover member; and means removably mounting said module structure to said strip member.

16. The apparatus of claim 15 wherein said strip member is formed of an electrically nonconductive material.

17. The apparauts of claim 15 wherein said strip member is formed of an electrically conductive material.

18. Electrical component mounting apparatus enabling the energization of electrical components when said apparatus is operatively connected to an energy source through a plurality of electrical conductors surrounded by an electrically non-conductive material, said electrical component mounting apparatus comprising:

a module structure removably mounted to said plurality of electrical conductors, said module structure including means remoably mounting an electrical lamp thereon, said module structure further including means removably connecting said electrical lamp across at least a predetermined two of said plurality of electrical conductors, said means removably connecting includes a first blade-like electrically conductive member, said first blade-like electrically conductive member being formed to be capable of physically penetrating said electrically non-conductive material and making electrical contact with at least one of said plurality of electrical conductors, said means removably connecting further including a second blade-like electrically conductive member, said second blade-like electrically conductive member being formed to be capable of physically penetrating said electrically non-conductive material and making electrical contact with at least a different one of said plurality of electrical conductors than electrically contacted by said first blade-like electrically conductive member, said module structure further including a housing means covering said means removably mounting said electrical lamp and said means removably connecting said electrical lamp, whereby said means removably mounting said electrical lamp and said means removably connecting said electrical lamp are not accessible to contact by an individual when said module structure is removably mounted to said plurality of electrical conductors.

19. Electrical component mounting apparatus for enabling the energization of electrical components when said apparatus is operatively connected to an energy source, said electrical component mounting apparatus comprising:

a one-piece strip member having a plurality of spaced-apart tunnel-like passages running longitudinally of the strip member, each spaced-apart tunnel-like passage structured to accept an electrically conductive member positioned therein, said plurality of spaced-apart tunnel-like passages lying in substantially a first plane, said strip member having at least one outside surface lying in substantially a second plane which is generally parallel to said first plane, said at least one outside surface including a predetermined plurality of apertures formed therein and located therein such that each predetermined one of said predetermined plurality of apertures is positioned over a predetermined different one of said plurality of spaced-apart tunnel-like passages;

a module structure removably mounted to said strip member, said module structure including means removably mounting an electrical lamp thereon, said module structure further including means removably connecting said electrical lamp between a predetermined plurality of the electrical conductive members when said electrical conductive members are operatively positioned in said spaced-apart tunnel-like pasasges, said means removably connecting extens through a predetermined plurality of said apertures formed in said at least one outside surface, said module structure further including a housing means covering said means removably mounting said electrical lamp and said means removably connecting said eletrical lamp, whereby said means removably mounting said electrical lamp and said means removably connecting said electrical lamp are not accessible to contact by an individual when said module structure is removably mounted to said plurality of electrical conductors; and means removably mounting said module structure to said strip member.

20. Electrical component mounting apparatus for enabling the energization of electrical components when said apparatus is opeatively connected to an energy source, said elecrical component mounting apparatus comprising:

a strip member having a plurality of spaced-apart grooves running longitudinally of the strip member and opening at a first face thereof, each spaced-apart groove structured to accept an electrically conductive member positioned in each spaced-apart groove;

a face cover member of electrically nonconductive material, asid face cover member structure to be positionable to cover said opening of said plurality of spaced-apart grooves, said face cover member including a predetermined plurality of apertures formed therein and located therein such that each predetermined one of said predetermined plurality of apertures is positioned over a predetermined different one of said plurality of spaced-apart grooves when said face cover member is positioned to cover said opening of said plurality of spaced-apart grooves, said face cover member including positioning means to assure that adjacent face cover members are properly oriented and positioned with respect to each other;

a module structure removably mounted to said strip member, said module structure including means removably mounting an electrical lamp thereon, said module structure further including means removably connecting said electrical lamp between a predetermined plurality of the electrical conductive members when said electrical conductive members are operatively positioned in said spaced-apart grooves, said means removably connecting extends through a predetermined plurality of said apertures formed in said face cover member, module structure further including a housing means covering said means removably mounting said electrical lamp and said means removably connecting said electrical lamp, whereby said means removably mounting said electrical lamp and said means removably connectign said electrical lamp are not accessible to contact by an individual when said module structure is removably mounted to said plurality of electrical conductors; and means removably mounting module structure to said strip member.

* * * * *